United States Patent [19]

Birch

[11] 4,413,194
[45] Nov. 1, 1983

[54] TTL OUTPUT CIRCUIT HAVING MEANS FOR PREVENTING OUTPUT VOLTAGE EXCURSIONS INDUCED BY NEGATIVE CURRENT REFLECTIONS

[75] Inventor: William A. Birch, Tempe, Ariz.

[73] Assignee: Motorola, Inc., Schaumburg, Ill.

[21] Appl. No.: 282,116

[22] Filed: Jul. 10, 1981

[51] Int. Cl.³ ............... H03K 19/003; H03K 19/084; H03K 19/088
[52] U.S. Cl. .................................. 307/456; 307/443; 307/454; 307/458
[58] Field of Search ............... 307/456, 443, 454, 457, 307/458, 254, 200 A, 549

[56] References Cited

U.S. PATENT DOCUMENTS

| | | | |
|---|---|---|---|
| 3,473,047 | 10/1969 | Bohn et al. | 307/456 |
| 3,641,362 | 2/1972 | Gamble | 307/456 |
| 3,958,136 | 5/1976 | Schroeder | 307/300 X |
| 3,999,080 | 12/1976 | Weathersby, Jr. et al. | 307/300 X |
| 4,255,670 | 3/1981 | Griffith | 307/454 X |

Primary Examiner—Larry N. Anagnos
Assistant Examiner—David R. Hudspeth
Attorney, Agent, or Firm—Vincent B. Ingrassia

[57] ABSTRACT

A transistor-transistor logic circuit includes an output stage comprising a pull-up and pull-down transistor and an input stage for receiving one or more binary logic signals. First and second current drive transistors regulate base drive to the pull-up and pull-down transistors respectively. A first switching transistor turns said first current drive transistor off when the binary signals reach a first logic level. A second switching transistor turns the second current drive transistor on when the binary logic signals reach the first logic level. In this manner, negative reflections at the output of the circuit will not result in the pull-up transistor and its associated current drive transistor being turned off.

5 Claims, 2 Drawing Figures

TTL OUTPUT CIRCUIT HAVING MEANS FOR PREVENTING OUTPUT VOLTAGE EXCURSIONS INDUCED BY NEGATIVE CURRENT REFLECTIONS

BACKGROUND OF THE INVENTION

1. Field of the Invention

This invention relates generally to high speed logic circuitry and, more particularly, to high speed transistor-transistor logic (TTL) circuits having improved output circuitry.

2. Description of the Prior Art

Prior art TTL logic circuits include first and second current drive transistors coupled between a source of binary input logic signals and first and second output transistors coupled in a push/pull configuration. The output devices are turned on and off depending upon the state of the binary logic input signals.

The output terminal of the TTL circuit is generally coupled to the junction of the first and second output transistor; i.e. the junction of the emitter of the pull-up transistor and the collector of the pull-down transistor. The output terminal may assume one of two distinct logic levels. When the pull-up transistor is in or near saturation and the pull-down transistor is off, the output terminal will rise to a binary one level. If, the pull-up transistor is off and the pull-down is in or near saturation, the output terminal will be at a binary zero level.

A problem associated with the prior art circuit manifests itself when the circuit is used to drive a highly reflective load. That is, voltage excursions may be induced in the output due to negative current reflections causing the pull-up transistor to turn off. Ringing or oscillation may occur if the pull-up transistor is in or near saturation causing the output terminal to be at a binary one level when the negative reflection appears. The pull-up transistor will be turned off due to the reflection; however, when the negative reflection terminates, the pull-up transistor will again turn on causing the output to go high which in turn may cause another reflection which in turn will cause the pull-up transistor to turn off, etc.

SUMMARY OF THE INVENTION

It is an object of the present invention to provide an improved transistor-transistor logic (TTL) circuit.

It is a further object of the present invention to provide an improved TTL logic circuit including means for reducing voltage excursions caused by negative current reflections at the circuit output.

It is a still further object of the present invention to provide an improved TTL logic circuit including means for maintaining the output pull-up transistor "on" in the presence of negative reflections at the circuit output.

According to a broad aspect of the invention there is provided in a logic circuit having input means for receiving one or more binary logic signals, a pull-up output transistor, a pull-down output transistor, a first current drive transistor for supplying drive to said pull-down transistor when said binary logic signals reach a first logic level, a second current drive transistor for diverting drive from said pull-up transistor when said binary logic signals reach said first logic level, each of said pull-up, pull-down, first current drive and second current drive transistor having base, emitter and collector terminals, the improvement comprising: first switching means coupled to said input means and to said first current drive transistor for turning on said first current drive transistor when said binary logic signals reach said first logic level; and second switching means coupled to said first switching means and to said second current drive transistor for turning on said second current drive transistor when said binary logic signals reach said first logic level.

According to a further aspect of the invention there is provided a logic circuit, comprising: input means for receiving one or more binary logic signals; a pull-up output transistor having base, emitter and collector terminals, said collector terminal adapted to be coupled to a first source of supply voltage; a pull-down output transistor having an emitter adapted to be coupled to a second source of supply voltage and a collector coupled to the emitter of said pull-up output transistor; first current drive means coupled to the base of said pull-down transistor for supplying base drive to said pull-down transistor when said binary logic signals reach a first logic level; second current drive means coupled to the base of said pull-up output transistor for diverting base drive to said pull-up output transistor when said binary logic signals reach said first logic level; first switching means coupled to said input means and to said first current drive means for turning on said first current drive means when said binary logic signals reach said first logic level; and second switching means coupled to said first switching means and to said second current drive means for turning said second current drive means on when said binary logic signals reach said first logic level.

The above and other objects, features and advantages of the present invention will be more clearly understood from the following detailed description taken in conjunction with the accompanying drawings, in which:

DESCRIPTION OF THE PREFERRED EMBODIMENT

Figure 1:
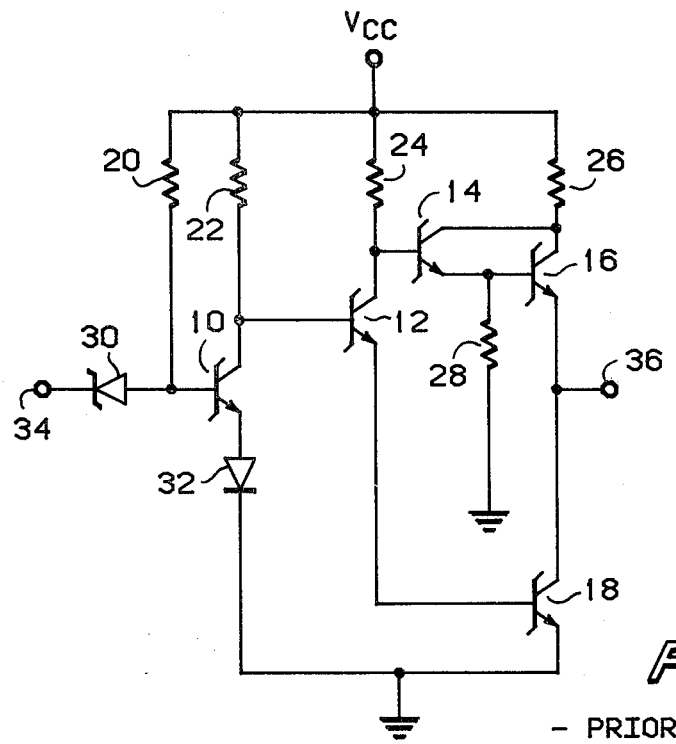
FIG. 1 is a schematic diagram of a prior art TTL output circuit.

FIG. 1 is a schematic diagram of the output circuitry of a TTL logic gate in accordance with the prior art. As can be seen, the circuit comprises Schottky transistors 10, 12, 14, 16 and 18, resistors 20, 22, 24, 26 and 28 and diodes 30 and 32. The circuit is equipped with an input terminal 34 and an output terminal 36. Transistor 12 is a current drive transistor having an emitter coupled to the base of pull-down transistor 18 for supplying current thereto. Transistor 14 is a second current drive transistor which supplies current to the base of pull-up transistor 16. Collector load resistors 22, 24 and 26 each having one terminal coupled to a source of supply voltage $V_{CC}$ and another terminal coupled to the collectors of transistors 10, 12 and 16 respectively establish the desired current levels for proper circuit operation. Resistor 24 also supplies drive to the base of transistor 14.

Switching transistor 10 has a collector coupled to the base of current drive transistor 12 and an emitter coupled to the anode of diode 32. The cathode of diode 32 and the emitter of pull-down transistor 18 are coupled to a source of a reference potential, in this case ground. A current source resistor 20 is coupled between the source of supply voltage $B_{CC}$ and the junction of the base of switching transistor 10 and the anode of diode 30. The cathode of diode 30 is coupled to input terminal 34.

The circuit operates as follows. With a binary zero at input terminal 34, diode 30 is forward biased and current flows through resistor 20 and diode 30. Since no base drive is being supplied to transistor 10, transistor 10 remains off. Base drive is, however, supplied via resistor 22 to the base of current drive transistor 12 turning it on. With transistor 12 on, base drive is supplied to transistor 18 turning it on. Current drive transistor 14 remains off and, as a result, pull-up transistor 16 remains off. With pull-up transistor 16 off and pull-down transistor 18 in or near saturation, the output at terminal 36 falls to a binary zero level.

If, on the other hand, a binary one level is applied to input terminal 34, diode 30 will be reverse biased and current will be supplied via resistor 20 to the base of transistor 10 turning it on. Current will flow through resistor 22 and transistor 10, and no base drive will be supplied to the base of transistor 12 maintaining it off. With transistor 12 off, current flowing through resistor 24 is supplied to the base of transistor 14 turning it on which in turn supplies base drive to pull-up transistor 16 turning it on. Since transistor 12 is off, no base drive is supplied to pull-down transistor 18. Therefore, with pull-up transistor 16 on and pull-down transistor 18 off the output at terminal 36 rises to a binary one level.

The problem associated with the circuit shown in FIG. 1 appears when a negative reflection appears at terminal 36. It must be remembered that Schottky transistor 18 is equivalent to a bipolar transistor having a Schottky diode coupled between its base and collector terminals; i.e., the anode of the Schottky diode is coupled to the base and cathode of the Schottky diode is coupled to the collector. When a negative voltage appears on output terminal 36, the diode clamp associated with transistor 18 becomes forward biased causing current drive transistor 12 to turn on. If transistor 12 turns on, no base drive is supplied to current drive transistor 14 thus turning pull-up transistor 16 off. As described previously, this will cause voltage excursions or possibly oscillations at output terminal 36.

Figure 2:
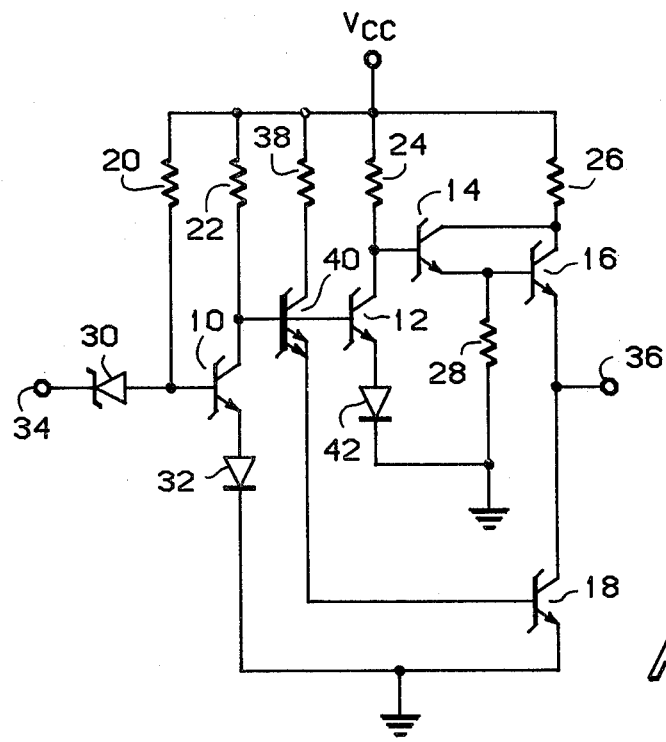
FIG. 2 is a schematic diagram of the inventive TTL output circuit.

The above problem of unwanted voltage excursions and oscillations may be solved using the circuit of FIG. 2 where like elements have been denoted with like reference numerals. As can be seen, the emitter of transistor 12 is no longer coupled to the base of pull-down transistor 18, but is coupled to ground via diode 42. Base drive to transistor 18 is now supplied by transistor 40. The collector of transistor 40 is coupled to $V_{CC}$ via resistor 38, and has a base electrode coupled to the collector of transistor 10 as is the base of transistor 12. While transistor 40 is shown as a dual emitter transistor both of which are coupled to the base of pull-down transistor 18, it should be clear that a single emitter transistor may be used.

As in the prior art circuit, when a binary one level is applied to input terminal 34, transistor 10 turns on causing transistors 12 and 40 to remain off. With transistor 12 off, base drive is supplied to pull-up transistor 16 via current drive transistor 14 and resistor 24 turning pull-up transistor 16 on. Since transistor 40 is off, no base drive is supplied to the base of pull-down transistor 18 causing it to remain off. Thus, the voltage at terminal 36 rises. Should a negative reflection now appear at terminal 36, the Schottky clamp associated with pull-down transistor 18 will become forward biased and transistor 40 will turn on. However, transistor 40 does not control current drive transistor 14 and pull-up transistor 16. Even if transistor 40 turns on, transistor 12 remains off keeping current drive transistor 14 and pull-up transistor 16 on. In this manner, the negative reflections appearing at terminal 36 are swamped by current flowing through transistor 16 preventing the negative overshoot.

The above description is given by way of example only. Changes in form and details may be made by one skilled in the art without departing from the scope of the invention.

I claim:

1. In a logic circuit having input means for receiving one or more binary logic signals, a pull-up output transistor, a pull-down output transistor having at least a base terminal, a first switching transistor having at least a base terminal, coupled to said input means, a first current drive transistor having at least a collector terminal, for supplying drive to said pull-up transistor when said binary logic signals reach said first logic level, the improvement comprising:

second current drive transistor means having base, emitter and collector terminals, said base coupled to the collector of said first switching transistor, said collector being connectible to a first source of supply voltage and said emitter coupled to the base of said pull-down transistor for supplying drive to said pull-down transistor when said binary logic signals reach said second logic level; and second switching transistor means having base, emitter and collector terminals, said base coupled to the collector of said first switching transistor, said collector coupled to the base of said first current drive transistor, and said emitter being connectible to a second source of supply voltage, said second switching transistor means for diverting drive from the base of said first current drive transistor when said binary logic signals reach said second logic level.

2. A circuit according to claim 1 wherein said second current drive transistor is a dual emitter transistor both of which are coupled to the base terminal of said pull-down transistor.

3. A circuit according to claim 2 wherein each of said pull-up, pull-down, first current drive, second current drive, first switching and second switching transistors are Schottky transistors.

4. A logic circuit, comprising:
input means for receiving one or more binary logic signals;
a pull-up output transistor having base, emitter and collector terminals, said collector terminal being connectible to a first source of supply voltage;
a pull-down output transistor having base, emitter and collector terminals, said emitter being connectible to a second source of supply voltage and said collector coupled to the emitter of said pull-up output transistor;
first current drive transistor means having base, emitter and collector terminals, said emitter being coupled to the base of said pull-up output transistor for supplying base drive to said pull-up output transistor when said binary logic signals reach a first logic level, said collector coupled to the collector of said pull-up output transistor and said base being connectible to a first source of supply voltage;

second current drive transistor means having base, emitter and collector terminals, said emitter being coupled to the base of said pull-down output transistor for supplying base drive to said pull-down output transistor when said binary logic signals reach said second logic level, and said collector being connectible to said first source of supply voltage;

first switching transistor means having base, emitter and collector terminals, said base being coupled to said input means, said collector being coupled to the base of said second current drive transistor means, and said emitter being connectible to a second source of supply voltage, for turning on said second current drive transistor means when said binary logic signals reach said second logic level; and second switching transistor means having base, emitter and collector terminals, said base coupled to the collector of said first switching transistor means, said emitter being connectible to said second source of supply voltage, and said collector being coupled to said first current drive transistor means for turning said first current drive transistor means on when said binary logic signals reach said first logic level.

5. A logic circuit according to claim 4 wherein each of said first and second switching transistors, first and second current drive transistors and said pull-up and pull-down transistors are Schottky transistors.

* * * * *